United States Patent [19]

Taguchi et al.

[11] Patent Number: 5,894,251
[45] Date of Patent: Apr. 13, 1999

[54] HIGH FREQUENCY FILTER HAVING SAW AND DIELECTRIC FILTERS WITH DIFFERENT FREQUENCY TEMPERATURE CHARACTERISTIC SIGNS

[75] Inventors: Yutaka Taguchi, Osaka; Kazuo Eda, Nara; Shun-ichi Seki, Hyogo; Keiji Onishi; Toru Yamada, both of Osaka, all of Japan

[73] Assignee: Matsushita Electric Industrial Co., Ltd., Osaka, Japan

[21] Appl. No.: 08/872,857

[22] Filed: Jun. 11, 1997

[30] Foreign Application Priority Data

Jun. 14, 1996 [JP] Japan ................. 8-154346

[51] Int. Cl.⁶ ..................... H03H 9/64; H01P 1/202
[52] U.S. Cl. ................ 333/193; 310/313 B; 310/315; 310/346; 333/206
[58] Field of Search ................... 333/193–196, 333/206; 310/313 R, 313 B, 313 C, 313 D, 315, 346

[56] References Cited

U.S. PATENT DOCUMENTS

| | | |
|---|---|---|
| 4,349,794 | 9/1982 | Kagiwada et al. ............ 310/313 D X |
| 4,509,165 | 4/1985 | Tamura ...................... 333/194 X |
| 4,672,255 | 6/1987 | Suzuki et al. ............... 310/313 A |
| 5,202,652 | 4/1993 | Tabuchi et al. .............. 333/193 |
| 5,254,962 | 10/1993 | Morris ...................... 333/193 |
| 5,467,065 | 11/1995 | Turunen et al. .............. 333/193 X |

FOREIGN PATENT DOCUMENTS

| | | |
|---|---|---|
| 44 45 002 | 6/1995 | Germany . |
| 52-019044 | 2/1977 | Japan . |
| 58-154917 | 9/1983 | Japan . |
| 61-230419 | 10/1986 | Japan . |
| 1-231417 | 9/1989 | Japan . |
| 3-222512 | 10/1991 | Japan . |
| 4-196829 | 7/1992 | Japan . |
| 7-15276 | 1/1995 | Japan ..................... 333/193 |
| 7-115303 | 5/1995 | Japan ..................... 333/193 |
| 7-176912 | 7/1995 | Japan ..................... 333/193 |

*Primary Examiner*—Robert Pascal
*Assistant Examiner*—Barbara Summons
*Attorney, Agent, or Firm*—Merchant, Gould, Smith, Edell, Welter & Schmidt, P.A.

[57] ABSTRACT

36° -rotated Y-cut X-propagation lithium niobate substrate ($LiNbO_3$) was used as a piezoelectric substrate to compose a surface acoustic wave filter and is connected with a dielectric filter in series. The dielectric filter having a sign of the frequency temperature characteristic which is opposite to that of the surface acoustic wave filter was used. Accordingly, a high frequency filter, comprising a surface acoustic filter and a dielectric filter connected in series, which can secure sufficient attenuation without an increase in the insertion loss within the band can be provided.

8 Claims, 6 Drawing Sheets

HIGH FREQUENCY FILTER HAVING SAW AND DIELECTRIC FILTERS WITH DIFFERENT FREQUENCY TEMPERATURE CHARACTERISTIC SIGNS

FIELD OF THE INVENTION

The present invention relates to a high frequency filter, more particularly relates to a high frequency filter in which a surface acoustic wave filter and a dielectric filter are connected in series.

BACKGROUND OF THE INVENTION

Recently, surface acoustic wave elements have been investigated intensively to be used as filters. Particularly, a portable communication apparatus has been developed and adapted for high frequency. Therefore, the development of a surface acoustic element, especially a surface acoustic filter, has been pursued. In the past, various methods to form a filter of high frequency band by using surface acoustic wave element, especially a filter of several 100 MHz, have been proposed. The typical examples include, a ladder-type filter composed of a plurality of surface acoustic wave resonators disclosed in Japanese Laid-Open Patent Publication No. 52-19044, a multi-electrode type filter disclosed in Japanese Laid-Open Patent Publication No. 58-154917 and a longitudinal mode type filter in which adjacent surface acoustic wave resonators are provided and a coupling between resonators is utilized. See Japanese Laid-Open Publication No. 3-222512, No. 61-230419 and No. 1-231417. In general, many characteristics of the surface acoustic wave filter are determined by the characteristics of the substrate. In particular, a pass band width of the filter and the temperature characteristic and the like are determined by the characteristics of the substrate.

Recently, due to the development of portable communication apparatus, the frequency band to be used becomes high, that is a region of quasi-micro wave. Particularly, in the U.S., "PCS" system is put to practical use, while in European countries, "PCN" system is put to practical use. In these systems, 1.8 GHz band and 1.9 GHz band are used respectively as a frequency. In a conventional portable communication system, for example, the Japanese analog system, 915 MHz to 940 MHz is used as a transmission frequency, 860 MHz to 885 MHz is used as a receiving frequency and a transmission/receiving frequency interval is 30 MHz. However, in the PCS system (1.8 GHz band), 1805 MHz to 1880 MHz is used as a receiving frequency, 1710 MHz to 1785 MHz is used as a transmission frequency and a transmission/receiving frequency interval is 20 MHz. In the PCS system, although the used frequency band becomes high as above-mentioned, the transmission/receiving frequency interval becomes narrower than that of the conventional portable communication system (30 MHz). The communication system is not a simultaneous transmission and reception, but a time-division system, however, it is required to secure a receiving band attenuation for a transmission filter and it is required to secure a transmission band attenuation for a receiving filter. Consequently, it is very difficult to obtain the filter used for PCS system. As a result, a surface acoustic wave filter composed of only one stage can not secure the required attenuation. Therefore, it is required to connect the surface acoustic wave filter with a dielectric filter in series to secure the sufficient attenuation. However, when a surface acoustic wave filter is connected with a dielectric filter in series, the insertion loss within a band at ordinary temperature is increased.

The inventors of this invention have concluded that it might be possible to decrease the insertion loss within a band at ordinary temperature to as small an amount as possible by connecting a surface acoustic filter having a predetermined frequency temperature characteristic with a dielectric filter having a predetermined frequency temperature characteristic in series.

SUMMARY OF THE INVENTION

This invention aims to solve the above-mentioned problems and provide a high frequency filter in which the insertion loss is not increased even if a surface acoustic wave filter is connected with a dielectric filter in series and a sufficient attenuation can be secured.

In the high frequency filter of this invention, a surface acoustic wave filter is connected with a dielectric filter in series and the sign of the frequency temperature characteristic of the surface acoustic wave filter is different from that of the dielectric filter to achieve the above-mentioned objective. According to the above-mentioned construction of the high frequency filter, sufficient attenuation can be secured while an increase in the insertion loss within a band at ordinary temperature is prevented.

It is preferable that the absolute value of the frequency temperature characteristic of the surface acoustic wave filter is substantially the same as that of the dielectric filter. According to the preferable example, even when the ambient temperature in use becomes low, sufficient attenuation can be secured.

It is preferable that a surface acoustic wave filter comprises an interdigital transducer (IDT) formed on a piezoelectric substrate. In this case, it is preferable that a piezoelectric substrate is one selected from a group consisting of lithium tantalate ($LiTaO_3$), lithium niobate ($LiNbO_3$) and crystal substrate. In this case, it is preferable that an interdigital transducer (IDT) is an aluminum electrode.

It is preferable that a dielectric filter is a dielectric notch filter. In this case, it is preferable that a dielectric filter is composed of a quarter wave length open-ended dielectric coaxial resonator.

THE DETAILED DESCRIPTION OF THE INVENTION

Figure 1:
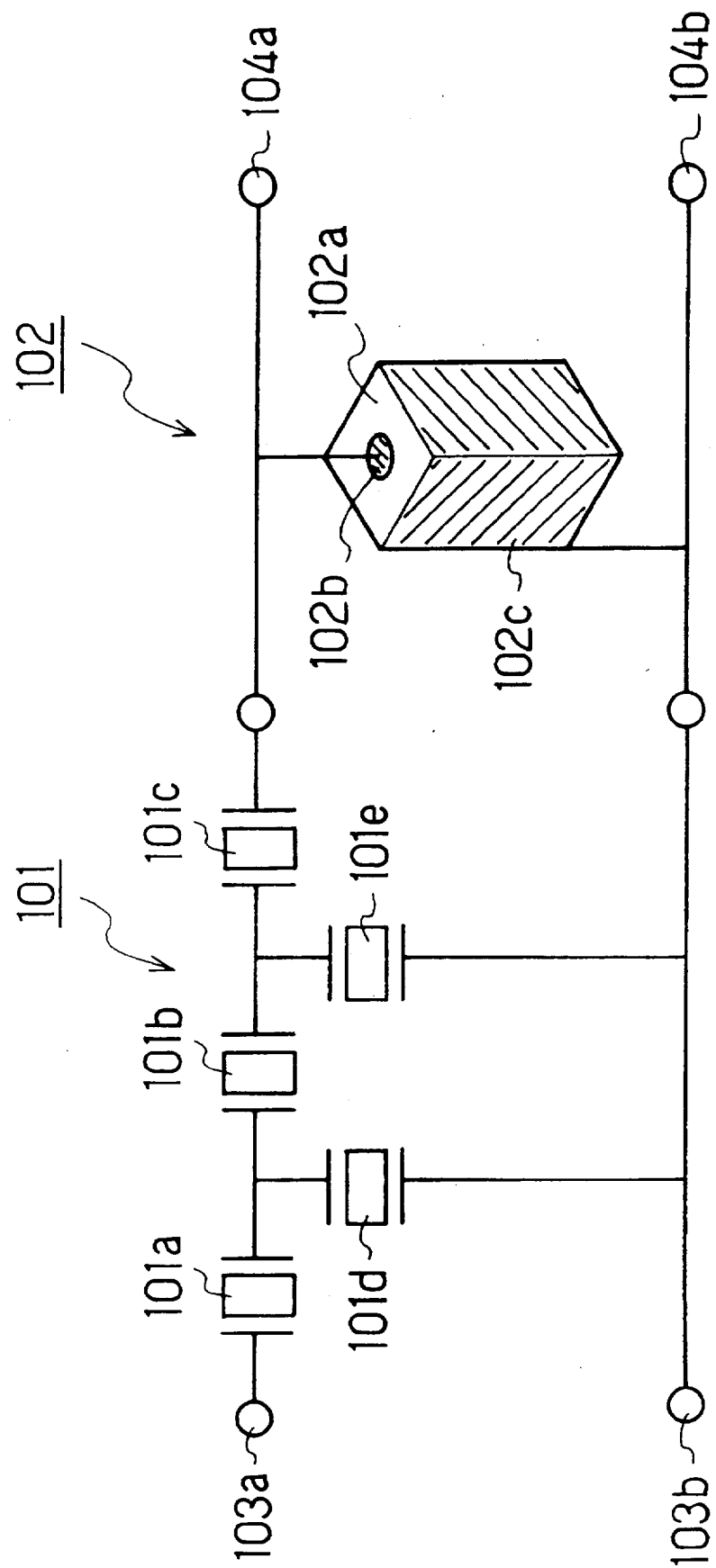
FIG. 1 is a schematic circuit diagram showing a high frequency filter of this invention.
Figure 2:
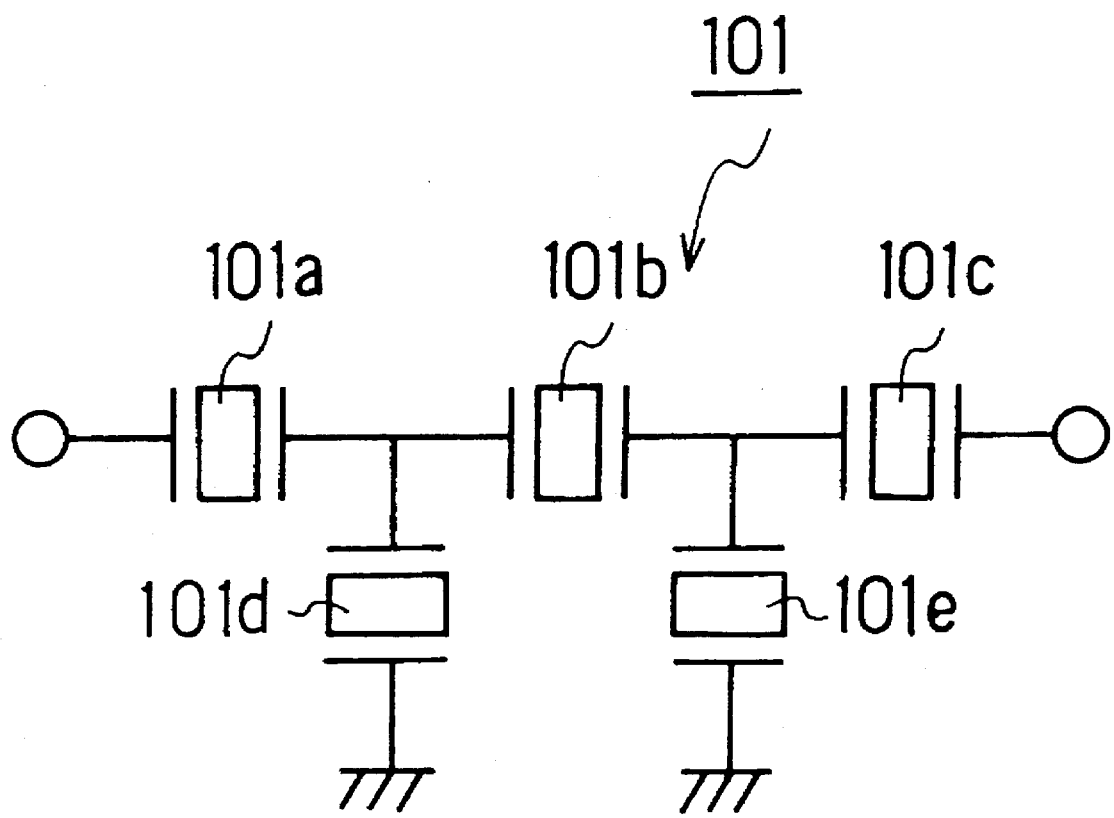
FIG. 2 is a schematic circuit diagram showing a surface acoustic wave filter used for a high frequency filter of this invention.
Figure 3:
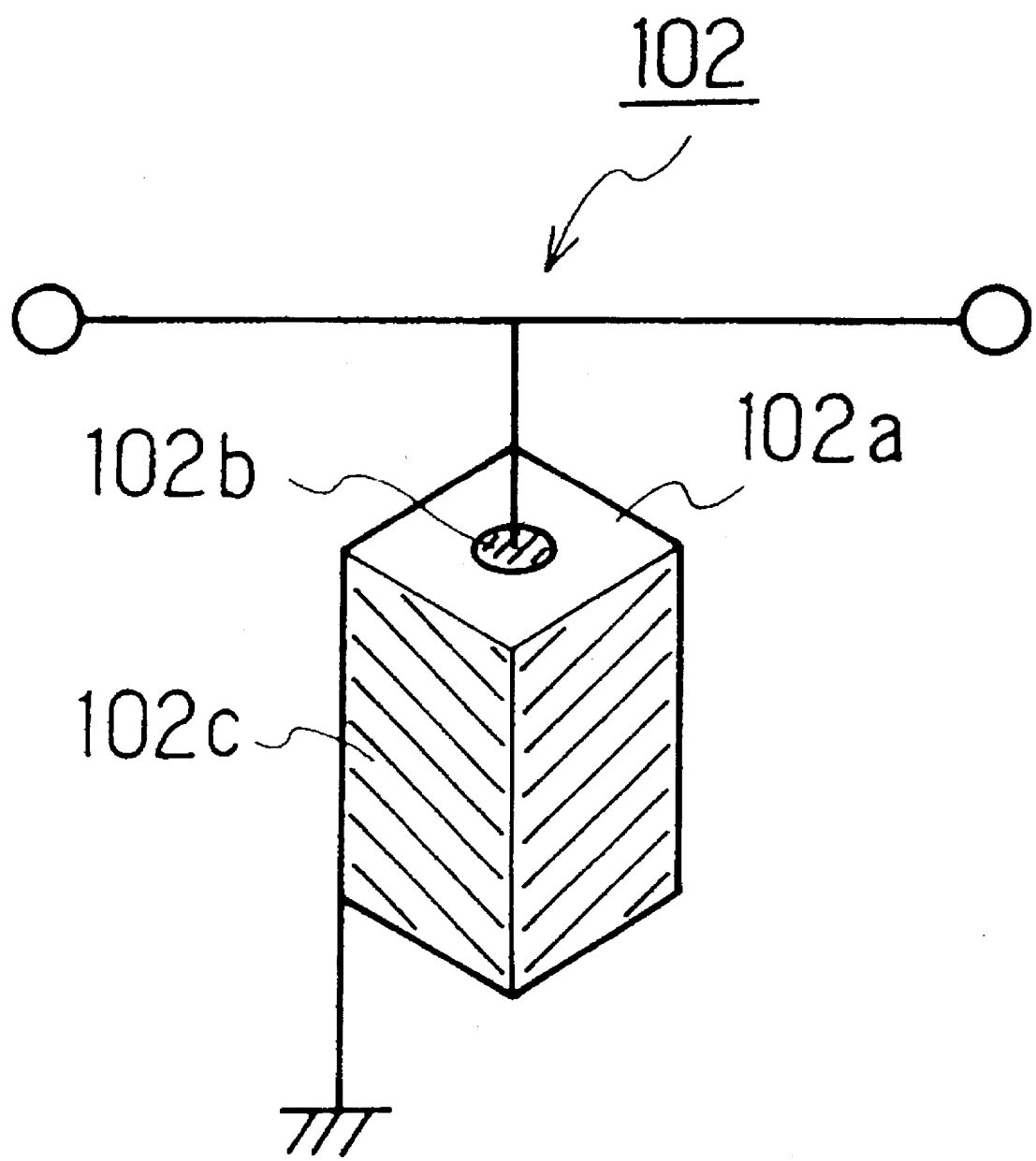
FIG. 3 is a schematic circuit diagram showing a dielectric filter used for a high frequency filter of this invention.

Hereinafter, the details of this invention will be explained referring to the drawings. FIG. 1 is a schematic circuit drawing showing a high frequency filter of this invention. FIG. 2 is a schematic circuit diagram showing a surface acoustic wave filter used for a high frequency filter of this invention. FIG. 3 is a schematic circuit diagram showing a dielectric notch filter used for a high frequency filter of this invention. As shown in FIG. 1, the high frequency filter comprises a surface acoustic wave filter 101 and a dielectric notch filter 102 connected in series. This filter is used as the transmission filter of the PCS system (1.8 GHz). In FIG. 1, 103a and 103b denote an input terminal and 104a and 104b denote an output terminal.

As shown in FIGS. 1 and 2, the surface acoustic wave filter 101 comprises three surface acoustic wave resonators 101a, 101b and 101c connected in series between an input-terminal and an output-terminal, a surface acoustic wave resonator 101d whose one end is connected between surface acoustic wave resonators 101a and 101b and whose other end is grounded, and a surface acoustic wave resonator 101e whose one end is connected between surface acoustic wave resonators 101b and 101c and whose other end is grounded. The surface acoustic wave resonators 101a, 101b, 101c, 101d and 101e are interdigital transducers composed of the aluminum electrode formed on the surface of the 36° -rotated Y-cut X-propagation lithium niobate substrate (LiNbO$_3$).

As shown in FIGS. 1 and 3, a dielectric notch filter 102 comprises a quarter wave length open-ended dielectric coaxial resonator 102a. An inside conductor 102b of the quarter wave length open-ended dielectric coaxial resonator 102a is connected between an input-terminal and an out-put terminal. An outside conductor 102c of the quarter wave length open-ended dielectric coaxial resonator 102a is grounded.

Figure 4:
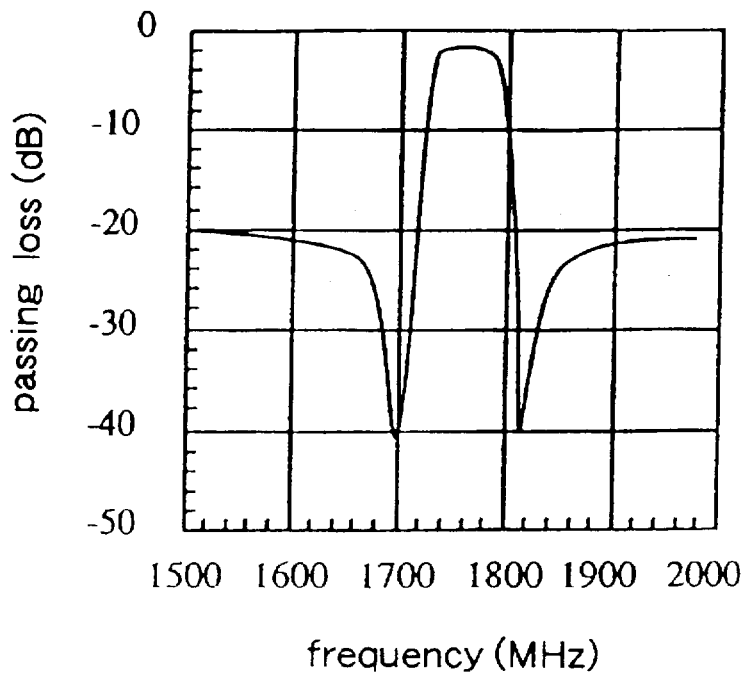
FIG. 4 is a graph showing the frequency characteristic of the surface acoustic wave filter used in the embodiment of this invention.
Figure 5:
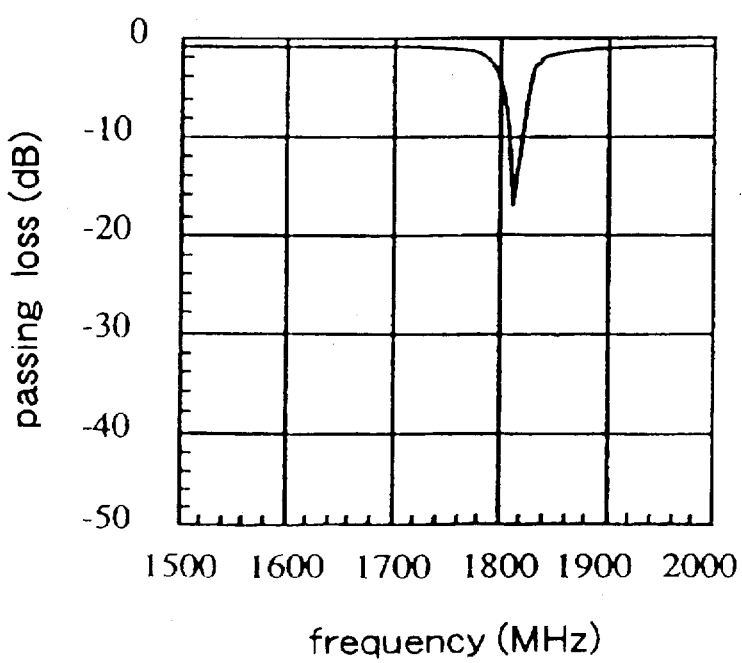
FIG. 5 is a graph showing the frequency characteristic of the dielectric filter used in the embodiment of this invention.
Figure 6:
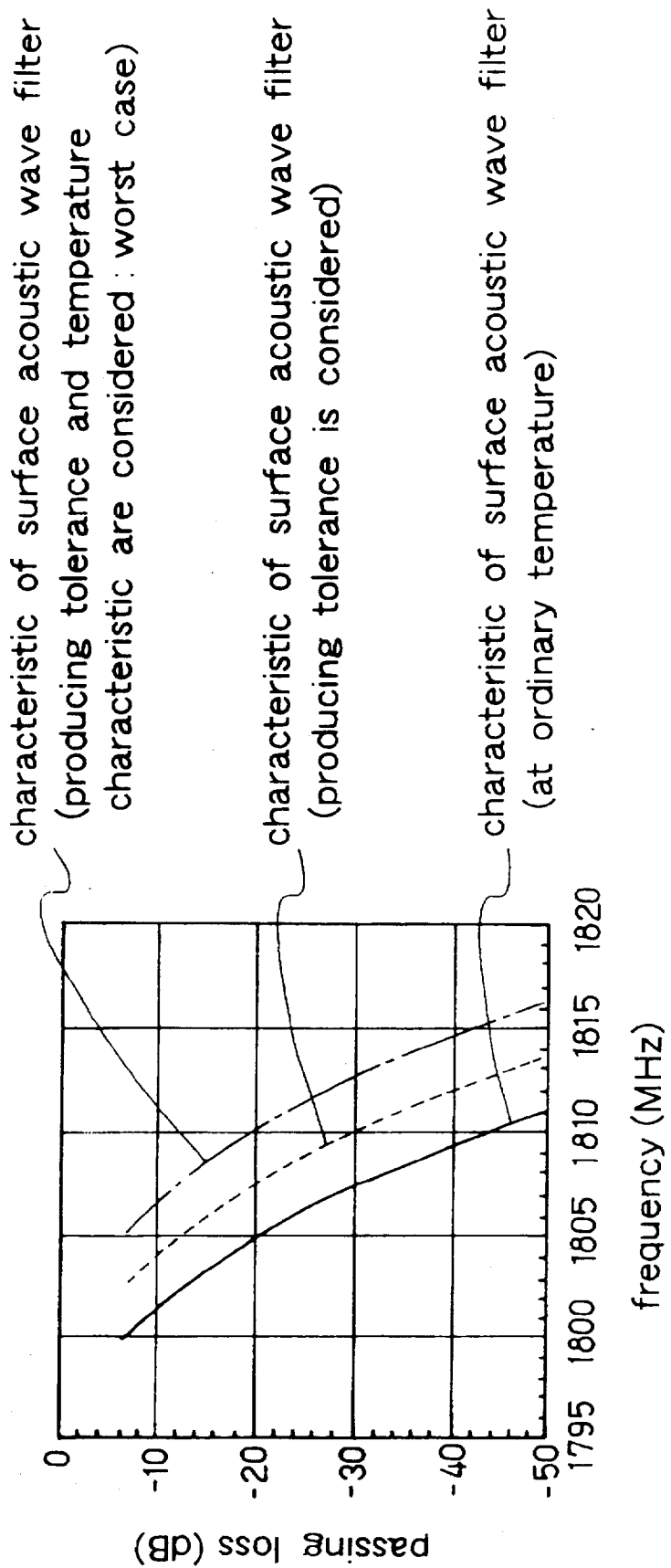
FIG. 6 is a graph showing the frequency characteristic of the surface acoustic wave filter in the pass band at the side of the high frequency.

FIG. 4 is a graph showing a frequency characteristic of the surface acoustic wave filter 101 and FIG. 5 is a graph showing a frequency characteristic of the dielectric filter 102. FIG. 6 is a graph showing a frequency characteristic of the high frequency side of the pass band of the surface acoustic wave filter 101, especially, the parts of the receiving frequency that are positioned most closely to the transmission side.

The 36° -rotated Y-cut X-propagation lithium niobate substrate (LiNbO$_3$) used in this embodiment shows a frequency temperature characteristic of −35 ppm/°C. In FIG. 6, the solid line indicates the frequency characteristic of the surface acoustic filter 101 at ordinary temperature. In FIG. 6, the broken line shows the frequency characteristic of the surface acoustic wave filter 101 in which at least ±2 MHz of producing tolerance, which is considered to be necessary, is taken into consideration. In addition, the alternate long and short dash line indicates the frequency characteristic of the surface acoustic wave filter 101 when the ambient temperature in use becomes lower (for example, −25° C.). As above-mentioned, when the worst case as indicated by the alternate long and short dash line in FIG. 6 is assumed an attenuation of only about 5 dB can be secured at a 1805 MHz receiving frequency. Therefore, if attenuation of 20 dB in the receiving band is required, it is necessary for a surface acoustic wave filter 101 to connect with the dielectric filter 102, which can secure 15 dB or more of attenuation when the frequency temperature characteristic of the dielectric filter 102 is substantially zero. However, when attenuation of 15 dB is obtained at the 1805 MHz receiving frequency, the insertion loss of the dielectric filter 102 becomes about 1 dB. Even if the producing tolerance is taken into account, the attenuation of about 12 dB in receiving band can be secured only by a surface acoustic wave filter at ordinary temperature as indicated by a broken line in FIG. 6. Consequently, it is sufficient for the dielectric filter 102 to have attenuation of about 8 dB. The insertion loss of the dielectric filter 102 becomes about 0.6 dB, which is improved. When the ambient temperature is decreased to a low level while keeping other conditions the same, the surface acoustic wave filter 101 in FIG. 6 changes to have a characteristic (attenuation of about 5 dB) as indicated by the alternate long and short dash line in FIG. 4. In this case, it is necessary for the dielectric filter 102 to secure attenuation of about 15 dB in order to secure a total of attenuation of about 20 dB for the surface acoustic wave filter 102 and the dielectric filter in the receiving band. When the ambient temperature is decreased to a low level and attenuation of about 15 dB is intended to be secured by the dielectric filter 102, the dielectric filter 102 having a sign for the frequency temperature characteristic that is opposite to that of the surface acoustic wave filter 101 may be used. As above mentioned, a high frequency filter (transmission filter of PCS system) which can secure sufficient attenuation in the receiving band while avoiding an increase of the insertion loss within the band at ordinary temperature can be realized by connecting the surface acoustic wave filter 101 with the dielectric filter 102, having a sign for the frequency temperature characteristic that is opposite to that of the surface acoustic filter, in series.

It is preferable that the absolute value of the frequency temperature characteristic of the dielectric filter 102 is almost the same as that of the surface acoustic wave filter 101 and the sign is opposite to that of the surface acoustic wave filter 101.

The reasons will be explained hereinafter.

Figure 7A:
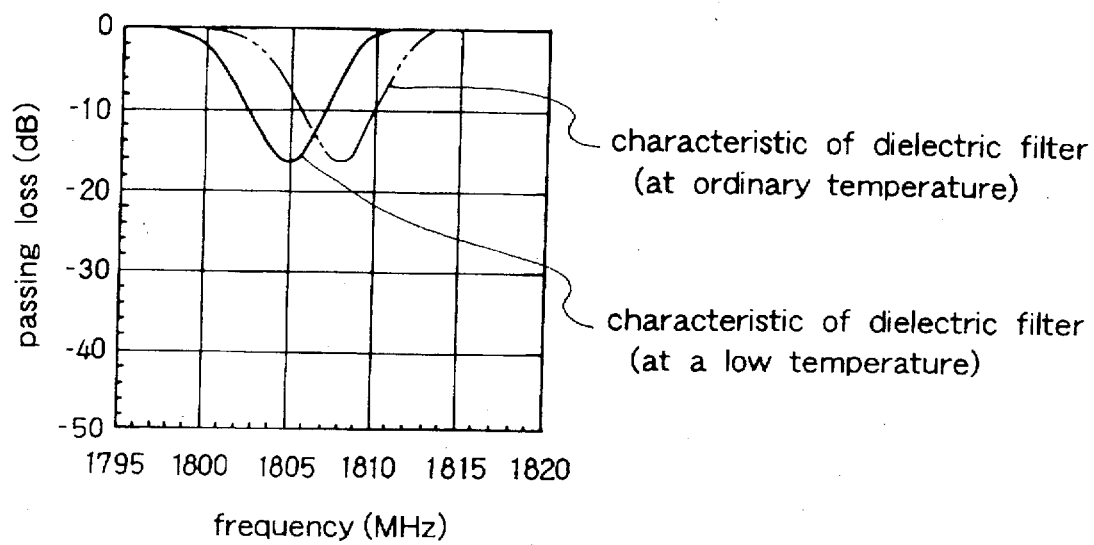
FIGS. 7(a) and 7(b) are graphs showing the frequency characteristic of the most preferable dielectric filter used in the embodiment of this invention.
Figure 7B:
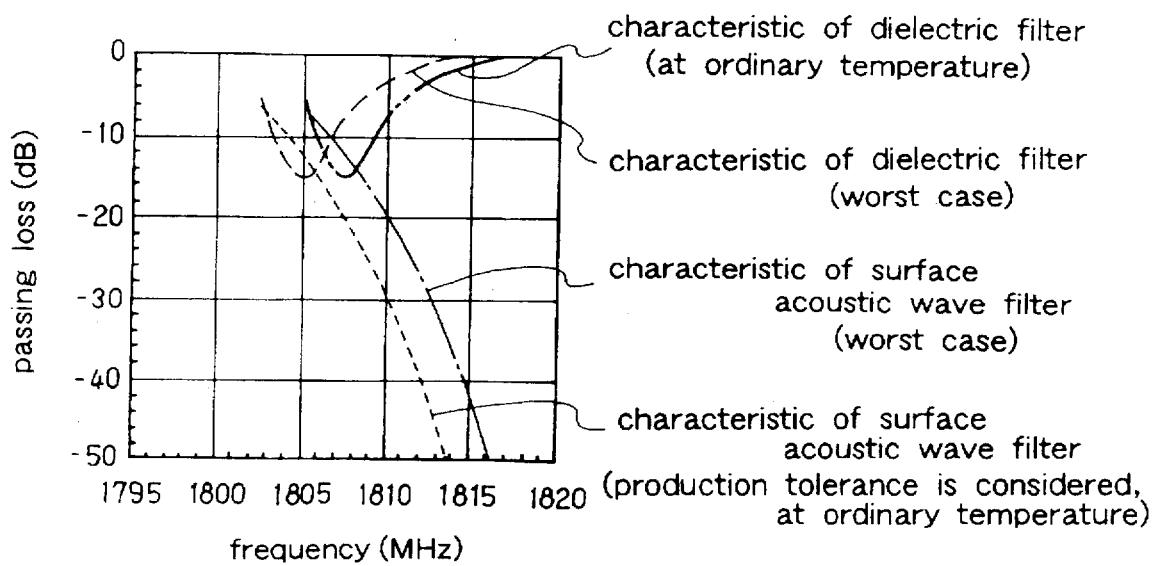

When the frequency characteristic of the surface acoustic wave filter 101 at ordinary temperature as indicated by the broken line in FIG. 6 is considered, it is required for the dielectric filter 102 to secure attenuation of about 8 dB at 1805MHz of receiving frequency. On the other hand, when the frequency characteristic of the surface acoustic wave filter 101 at the lowest temperature as indicated by the alternate long and short dash line in FIG. 6 is considered, it is required for the dielectric filter 102 to secure attenuation of about 15 dB at 1805MHz of receiving frequency. When the ambient temperature is at a low level, attenuation of 20 dB can not be secured by only the surface acoustic wave filter 101 at the receiving frequency smaller than 1810 MHz. Therefore, in the region of the receiving frequency smaller than 1810 MHz, it is required for the dielectric filter 102 to secure the attenuation to compensate the attenuation secured by the surface acoustic wave filter 101. When the characteristic of the dielectric filter 102 (in this embodiment, the notch filter is used) is considered (for example, the characteristic as shown in FIG. 5), the characteristic as indicated by the solid line in FIG.7 (a) is required. When the ambient temperature is changed from the lowest to the ordinary temperature, the characteristic as indicated by the alternate long and two short dashes line in FIG. 7(a) is required. As above-mentioned, the passing loss of the dielectric filter 102 can be decreased by setting the attenuation band of the dielectric filter 102 away from the passing band of the surface acoustic wave filter 101. In FIG. 7 (b), the alternate long dash line indicates the frequency characteristic of the dielectric filter 102 when the ambient temperature in use becomes the lowest. The absolute value of the frequency temperature characteristic of the dielectric filter 102 is the same as that of the surface acoustic wave filter 101 (−35 ppm/°C.) and the sign is opposite to that of the surface acoustic wave filter 101.

In this embodiment, the 36° -rotated Y-cut X-propagation lithium niobate substrate (LiNbO$_3$) was used as a piezoelectric substrate, however, it is not limited thereto. For example, the same effect can be obtained by using the lithium tantalate substrate or the crystal substrate.

In this embodiment, a surface acoustic wave filter 101 having the construction as shown in FIG. 2 was used, however, it is not limited thereto but any construction that can obtain the filter characteristic can be used.

In this embodiment, a dielectric notch filter 102 was explained as an example of the dielectric filter, however, it is not limited thereto. For example, the other type of the filter such as a low pass filter can be used.

In this embodiment, the surface acoustic wave filter 101 is positioned at the side of the input terminal 103a and 103b, and the dielectric filter 102 is positioned at the side of the output terminal 104a and 104b, however, the constitution is not limited thereto. The dielectric filter 102 may be positioned at the side of the input terminal 103a and 103b and the surface wave wave filter 101 may be positioned at the side of the output terminal 104a and 104b.

In this embodiment, the filter of 1.8 GHz band was explained as an example, however, it is not necessarily limited to the filter of 1.8 GHz band.

This invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, and all changes which come within the meaning and range of equivalency of the claims are intended to be embraced therein.

What is claimed is:

1. A high frequency filter comprising a surface acoustic wave filter and a dielectric filter connected in series, wherein a sign of the frequency temperature characteristic of said surface acoustic wave filter is different from that of said dielectric filter.

2. A high frequency filter as claimed in claim 1, wherein the absolute value of the frequency temperature characteristic of a surface acoustic wave filter is substantially same as that of the dielectric filter.

3. A high frequency filter as claimed in claim 1, wherein said surface wave filter comprises an interdigital transducer (IDT) formed on a piezoelectric substrate.

4. A high frequency filter as claimed in claim 3, wherein said piezoelectric substrate is one selected from a group consisting of lithium tantalate (LiTaO$_3$), lithium niobate (LiNbO$_3$) and crystal substrate.

5. A high frequency filter as claimed in claim 3, wherein said interdigital transducer (IDT) is an aluminum electrode.

6. A high frequency filter as claimed in claim 1, wherein said dielectric filter is a dielectric notch filter.

7. A high frequency filter as claimed in claim 6, wherein said dielectric filter is composed of a quarter wave length open-ended dielectric coaxial resonator.

8. A high frequency filter as claimed in claim 1, wherein said surface acoustic wave filter is a band-pass filter.

* * * * *